(12) United States Patent
Su et al.

(10) Patent No.: US 9,398,692 B2
(45) Date of Patent: Jul. 19, 2016

(54) INTERCONNECTING CONDUCTION STRUCTURE FOR ELECTRICALLY CONNECTING CONDUCTIVE TRACES OF FLEXIBLE CIRCUIT BOARDS

(71) Applicant: ADVANCED FLEXIBLE CIRCUITS CO., LTD., Taoyuan County (TW)

(72) Inventors: Kuo-Fu Su, Taoyuan County (TW); Gwun-Jin Lin, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 96 days.

(21) Appl. No.: 14/446,605

(22) Filed: Jul. 30, 2014

(65) Prior Publication Data

US 2015/0327368 A1 Nov. 12, 2015

(30) Foreign Application Priority Data

May 7, 2014 (TW) .............................. 103116189 A

(51) Int. Cl.
*H05K 1/00* (2006.01)
*H05K 1/11* (2006.01)
*H05K 1/02* (2006.01)
*H05K 1/14* (2006.01)

(52) U.S. Cl.
CPC ................ *H05K 1/118* (2013.01); *H05K 1/113* (2013.01); *H05K 1/0215* (2013.01); *H05K 1/144* (2013.01); *H05K 2201/058* (2013.01)

(58) Field of Classification Search
CPC ............. H05K 1/00; H05K 1/02; H05K 1/03; H05K 1/11; H05K 1/16; H05K 3/10; H05K 3/46; H01L 21/02; H01L 21/48; H01L 21/82
USPC ................ 174/254–256, 260, 262, 264, 266; 361/749; 438/128; 439/75; 29/850
See application file for complete search history.

(56) References Cited

U.S. PATENT DOCUMENTS

| | | | |
|---|---|---|---|
| 5,892,271 A * | 4/1999 | Takeda ................. | H01L 21/563 257/668 |
| 6,252,176 B1 * | 6/2001 | Kuramochi et al. ......... | 174/255 |
| 6,329,610 B1 * | 12/2001 | Takubo et al. ............... | 174/264 |
| 6,590,165 B1 * | 7/2003 | Takada et al. ............... | 174/266 |
| 7,575,442 B2 * | 8/2009 | Ogata et al. .................... | 439/75 |
| 2003/0150644 A1 * | 8/2003 | Takada et al. ................ | 174/262 |
| 2005/0257952 A1 * | 11/2005 | Morimoto et al. ........... | 174/256 |
| 2006/0102386 A1 * | 5/2006 | Morimoto et al. ........... | 174/260 |
| 2007/0148829 A1 * | 6/2007 | Yoshino et al. .............. | 438/128 |
| 2009/0244859 A1 * | 10/2009 | Muro et al. .................... | 361/749 |
| 2010/0305420 A1 * | 12/2010 | Curry ............................ | 600/345 |
| 2013/0271388 A1 * | 10/2013 | Chu et al. ....................... | 345/173 |
| 2013/0318785 A1 * | 12/2013 | Hsu et al. ........................ | 29/850 |
| 2014/0374147 A1 * | 12/2014 | Lin et al. ....................... | 174/254 |
| 2014/0374148 A1 * | 12/2014 | Su et al. ........................ | 174/254 |

* cited by examiner

*Primary Examiner* — Xiaoliang Chen
(74) *Attorney, Agent, or Firm* — Rosenberg, Klein & Lee

(57) ABSTRACT

An interconnecting conduction structure for electrically connecting conductive traces of a lapped flexible circuit board is disclosed. The lapped flexible circuit board includes a first flexible circuit board and a second flexible circuit board. A through hole is formed in the second flexible circuit board and an interconnecting conduction member is filled in the through hole of the second flexible circuit board. The interconnecting conduction member is electrically connected to a second solder pad of the second flexible circuit board and a first solder pad of the first flexible circuit board in order to formed a lapped connection between conductive traces of the first flexible circuit board and the second flexible circuit board.

11 Claims, 5 Drawing Sheets

INTERCONNECTING CONDUCTION STRUCTURE FOR ELECTRICALLY CONNECTING CONDUCTIVE TRACES OF FLEXIBLE CIRCUIT BOARDS

BACKGROUND OF THE INVENTION

1. Field of the Invention

The present invention relates to a structure of flexible circuit boards, and in particular to an interconnecting conduction structure for electrically connecting conductive traces of a lapped flexible circuit board in which at least two flexible-circuit boards are stacked and an interconnecting conduction is formed there between.

2. The Related Arts

Flexible circuit boards have been widely used in various electronic products, particularly thin and light-weighted electronic products. For example, consumer electronic devices, such as mobile phones, digital cameras, computer peripheral devices, flat display devices, and game machines, are the commonly known applications of the flexible circuit boards.

The amount of data transmitted through signal transmission lines of the electronic devices is increasingly expanded and thus, the necessary number of the signal transmission lines is also increased. To suit the trend of the electronic devices being made thin, compact and light-weighted, the line width of conductive wiring of the flexible circuit boards is made increasingly smaller.

To cope with the situation that the number of signal transmission lines is increasingly raised and the width of the conductive traces is increasingly decreased, most the manufacturers adopt the solutions of increasing the number of signal transmission lines, increasing the number of signal terminals, and increasing the width of the flexible circuit board. With the attention being paid to the number and conductive trace width of signal transmission lines, there is another concern that the power consumption of the modern electronic devices is also getting increased. In addition, in the structural arrangements of the flexible circuit boards of all sorts of electronic product, grounding traces are also a structure of importance.

The above-mentioned solutions that are conventionally adopted by the manufacturers do not meet the needs discussed above. It is thus a challenge of the manufacturers of the related fields to provide a structure of a flexible circuit board that meets the above discussed needs.

SUMMARY OF THE INVENTION

Thus, for the purposes of handling the above issues, an object of the present invention is to provide a wire lapping connection structure of flexible circuit boards, in which at least two flexible circuit boards are stacked and bonded and a lapping connection is formed between wires.

Another object of the present invention is to provide a structure that forms lapping interconnection between conductive traces of at last two flexible circuit boards. By means of a simple interconnection structure, at least two flexible circuit boards are stacked and bonded and conductive traces of the flexible circuit boards are electrically interconnected in order to cope with the needs that the number of signal transmission lines of the flexible circuit boards is increasingly expanded, the line width of the conductive traces is increasingly decreased, the consumption of electrical power is getting increased, and the size of grounding traces is also increasingly expanded.

The technical solution that the present invention adopts to achieve the above objects is that a second flexible circuit board that has a through hole formed therein is stacked on a first flexible circuit board and an interconnecting conduction member is filled in the through hole of the second flexible circuit board. The interconnecting conduction member electrically connects the second solder pad of the second flexible circuit board and the first solder pad of the first flexible circuit board in order to form a lapped connection between conductive traces of the first flexible circuit board and the second flexible circuit board.

The first solder pad of the first flexible circuit board is electrically connected to at least one first conductive trace laid on the first substrate. The first conductive trace comprises one of a power trace, a grounding trace, and a signal transmission trace.

The second solder pad of the second flexible circuit board is electrically connected to at least one second conductive trace laid on the second substrate. The second conductive trace comprises one of a power trace, a grounding trace, and a signal transmission trace.

The interconnecting conduction member comprises one of silver, aluminum, copper, tin, a conductive carbon paste, a conductive particle paste layer.

The second substrate comprises at least one third conductive trace formed on a surface thereof opposite to the second conductive trace.

An insulation layer is formed to cover a surface of the interconnecting conduction member.

The first flexible circuit board and the second flexible circuit board are each one of a single-sided board, a double-sided board, a multiple-layered board, and a rigid-flex board.

The expanded hole wall comprises a hole wall conductive layer formed thereon and the expanded hole wall is shaped in the form of one of a circle, a rectangle, and a square.

The efficacy is that when at least two flexible circuit boards are stacked and coupled together, the interconnecting conduction member of the present invention can be used to form a lapped connection between the solder pads and conductive traces of different ones of the flexible circuit boards in order to form connection between powder traces, grounding traces, and signal transmission traces of the flexible circuit boards.

BRIEF DESCRIPTION OF THE DRAWINGS

The present invention will be apparent to those skilled in the art by reading the following description of preferred embodiments of the present invention, with reference to the attached drawings, in which.

DESCRIPTION OF THE PREFERRED EMBODIMENTS

Figure 1:
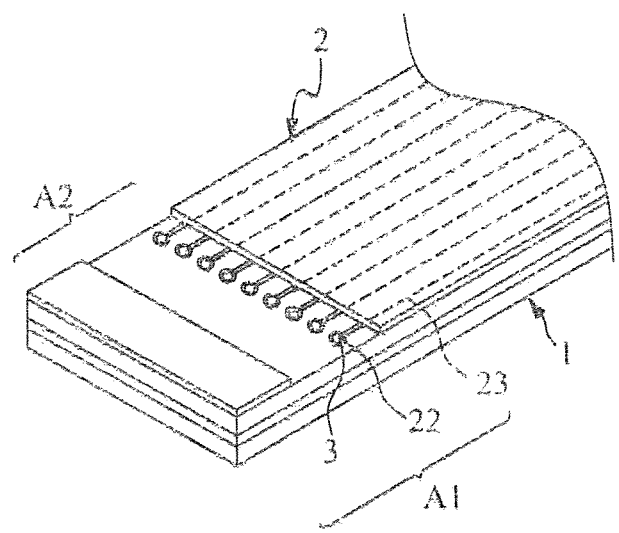
FIG. 1 is a perspective view showing a first embodiment according to the present invention, where a first flexible circuit board and a second flexible circuit board are stacked and bonded to each other.
Figure 2:
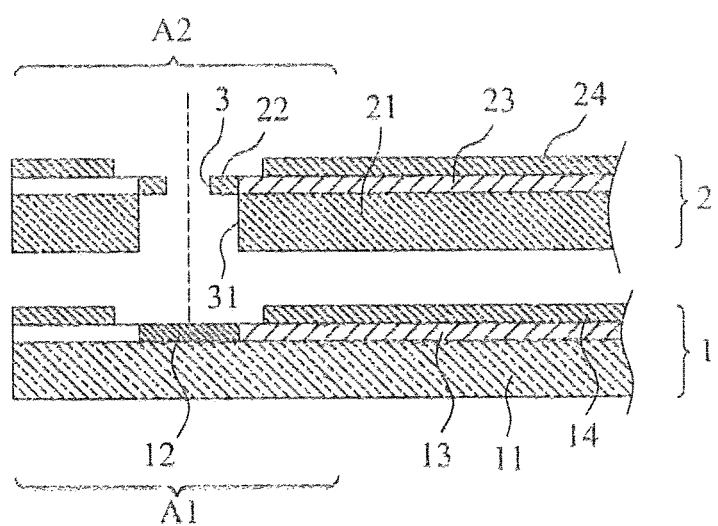
FIG. 2 is a cross-sectional view showing the first embodiment of the present invention, with the first flexible circuit board and the second flexible circuit board being detached from each other.

With reference to the drawings, FIG. 1 is a perspective view showing a first embodiment according to the present invention, where a first flexible circuit board 1 and a second flexible circuit board 2 are stacked and bonded to each other to form a lapped flexible circuit board; and FIG. 2 is a cross-sectional view showing the first embodiment of the present invention, with the first flexible circuit board and the second flexible circuit board being detached from each other.

As shown in the drawings, a first flexible circuit board 1 comprises a first substrate 11. The first substrate 11 defines a first stacking section A1 and comprises at least one first solder pad 12 formed in the first stacking section A1. In the instant embodiment, the first flexible circuit board 1 is a single-sided board.

The first solder pad 12 of the first flexible circuit board 1 is electrically connected to at least one first conductive trace 13 laid on the first substrate 11. The first conductive trace 13 may serve as one of a power trace, a grounding trace, and a signal transmission trace of the first flexible circuit board 1. Finally, a first insulation cover layer 14 is set to cover a surface of the first conductive trace 13.

A second flexible circuit board 2 comprises a second substrate 21. The second substrate 21 defines a second stacking section A2 and comprises at least one second solder pad 22 formed in the second stacking section A2. In the instant embodiment, the second flexible circuit board 2 is a single-sided board.

The second solder pad 22 of the second flexible circuit board 2 is electrically connected to at least one second conductive trace 23 laid on the second substrate 21. The second conductive trace 23 may serve as one of a power trace, a grounding trace, and a signal transmission truce of the second flexible circuit board 2. Finally, a second insulation cover layer 24 is set to cover a surface of the second conductive trace 23.

At least one through hole 3 extends through the second stacking section A2 of the second flexible circuit board 2 and the through hole 3 extends through the second solder pad 22 and the second substrate 21.

Figure 3A:
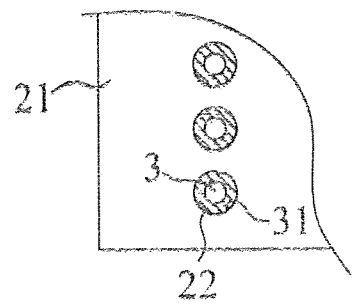
FIG. 3A is a bottom view showing expanded holes of FIG. 2 are circular.
Figure 3B:
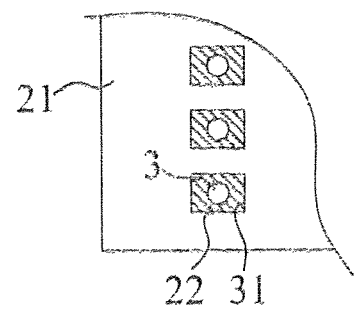
FIG. 3B is a bottom view showing expanded holes of FIG. 2 are rectangular or square.

In a preferred embodiment of the present invention, the through hole 3 comprises an expanded hole wall 31 formed in the second substrate 21 where the extension thereof is made. FIG. 3A is a bottom view of the expanded hole wall 31 of FIG. 2, showing the expanded hole wall 31 is of a structure of a circular hole. FIG. 3B is a bottom view of the expanded hole wall 31 of FIG. 2, showing the expanded hole wall 31 is of a structure of a rectangular or square hole. It is certain that the through hole 3 may be a through hole having a vertical wall. If necessary, a hole wall conductive layer may be formed on an inside surface of the expanded hole wall 31.

Figure 4:
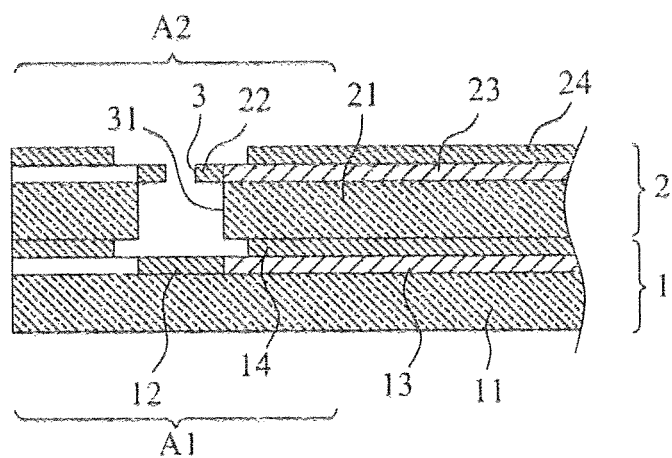
FIG. 4 is a cross-sectional view showing the first embodiment of the present invention with the first flexible circuit board and the second flexible circuit stacked and bonded to each other.

Referring to FIG. 4, to stack the second flexible circuit board 2 on the first flexible circuit board 1, the second stacking section A2 of the second flexible circuit board 2 is set overlapping the first stacking section A1 of the first flexible circuit board 1 and the through hole 3 of the second flexible circuit board 2 exactly corresponds, in position, to the first solder pad 12 of the first flexible circuit board 1.

Figure 5:
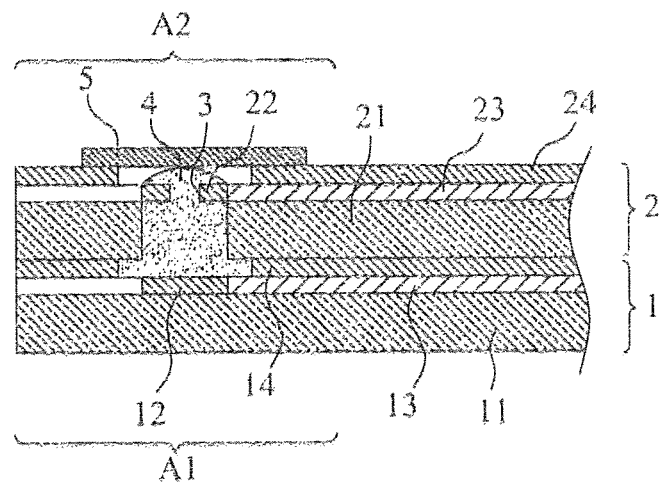
FIG. 5 is a cross-sectional view showing the condition where the first flexible circuit board and the second flexible circuit board are stacked and bonded to each other and a lapping connection is formed according to the present invention.

Referring to FIG. 5, after the second flexible circuit board 2 has been stacked on the first flexible circuit board 1, an interconnecting conduction member 4 is filled and deposited in the through hole 3. The interconnecting conduction member 4 may be selected from one of sliver, aluminum, copper, tin, conductive carbon paste, and conductive particle paste layer, and the interconnecting conduction member 4 is completely filled up the entire interior space defined by the expanded hole wall 31 so that the interconnecting conduction member 4 is electrically connected to the second solder pad 22 of the second flexible circuit board 2 and the first solder pad 12 of the first flexible circuit board 1. Preferably, an insulation layer 5 is further set on a surface of the interconnecting conduction member 4.

Figure 6:
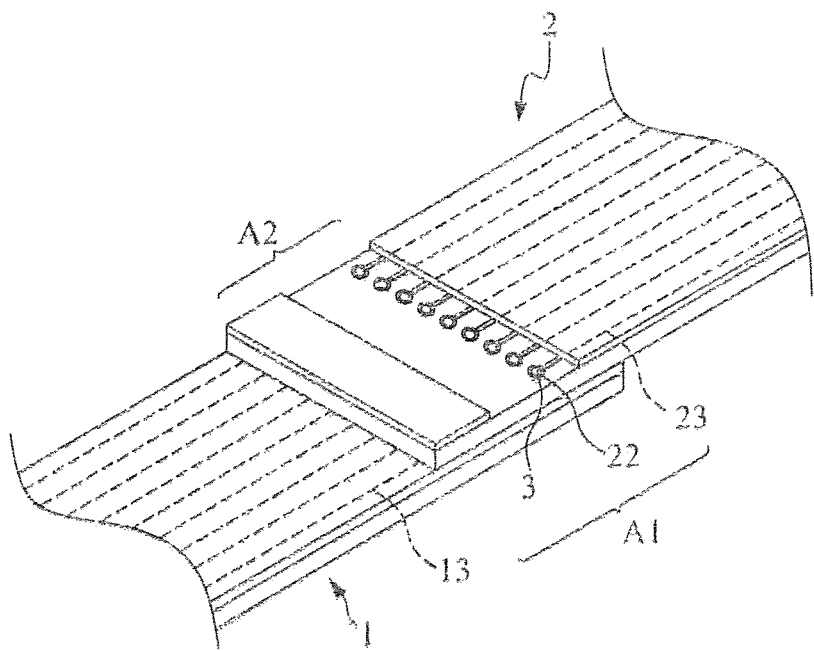
FIG. 6 is a perspective view showing a second embodiment of the present invention, where a first flexible circuit board and a second flexible circuit board are stacked in an end-lapped manner.

In the embodiment shown in FIG. 1, the first flexible circuit board 1 and the second flexible circuit board 2 are stacked in such a way that they are vertically aligned with each other. FIG. 6 is a perspective view showing a second embodiment of the present invention, where the first flexible circuit board 1 and the second flexible circuit board 2 are stacked in an end-lapped manner and structures, such as the through hole 3, the expanded hole wall 31, and the interconnecting conduction member 4, are similar to what described with reference to the first embodiment.

Figure 7:
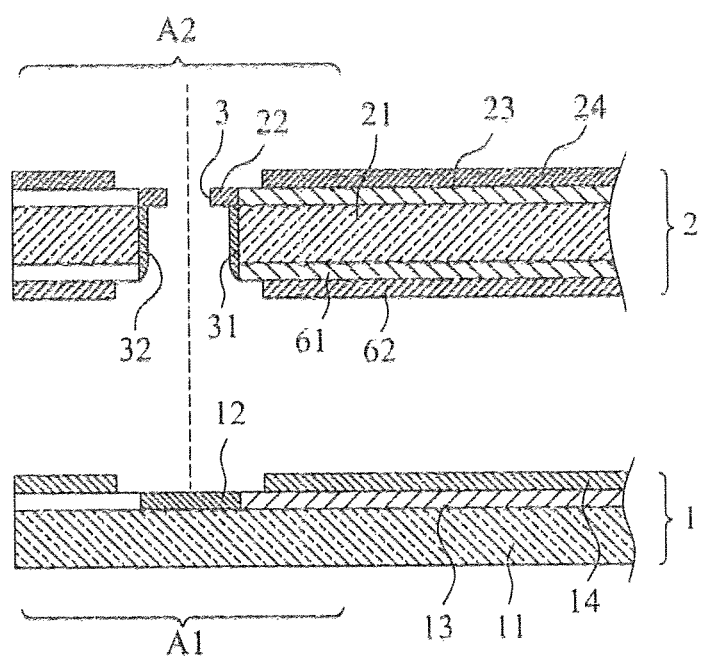
FIG. 7 is a cross-sectional view showing a third embodiment of the present invention with a first flexible circuit board and a second flexible circuit board being detached from each other.

FIG. 7 is a cross-sectional view showing a third embodiment of the present invention with the first flexible circuit board 1 and the second flexible circuit board 2 being detached from each other. In the instant embodiment, the first flexible circuit board 1 is a double-sided board. The instant embodiment comprises constituent components/parts that are similar to those of the first embodiment and similar components/parts are designated with the same reference numerals for consistency. In the instant embodiment, a difference from the first embodiment is that the second substrate 21 of the second flexible circuit board 2 comprises at least one third conductive trace 61 formed on a surface thereof opposite to the second conductive trace 23 (namely the surface facing the first flexible circuit board 1). The third conductive trace 61 may serve as one of a power trace, a grounding trace, and a signal transmission trace of the second flexible circuit board 2. Further, a hole wall conductive layer 32 is further formed on an inside surface of the expanded hole wall 31.

Figure 8:
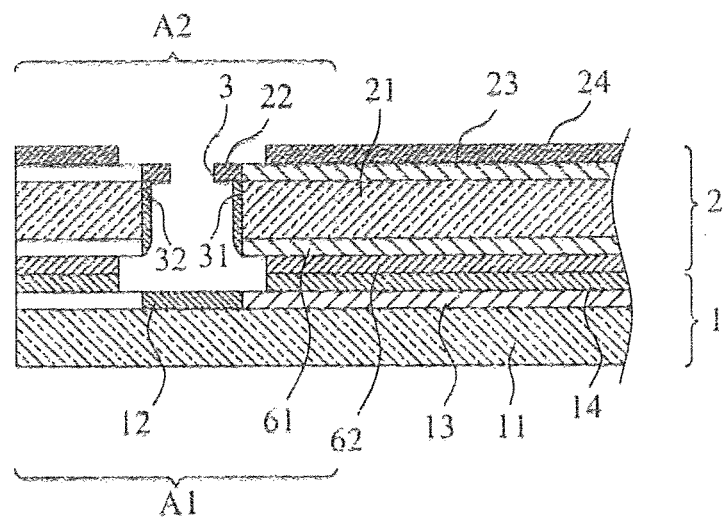
FIG. 8 is a cross-sectional view of the third embodiment according to the present invention with the first flexible circuit board and the second flexible circuit board stacked and bonded to each other.

Referring to FIG. 8, the second stacking section A2 of the second flexible circuit board 2 is overlapped on the first stacking section A1 of the first flexible circuit board 1 with the through hole 3 of the second flexible circuit board 2 corresponding exactly in position to the first solder pad 12 of the first flexible circuit board 1.

Figure 9:
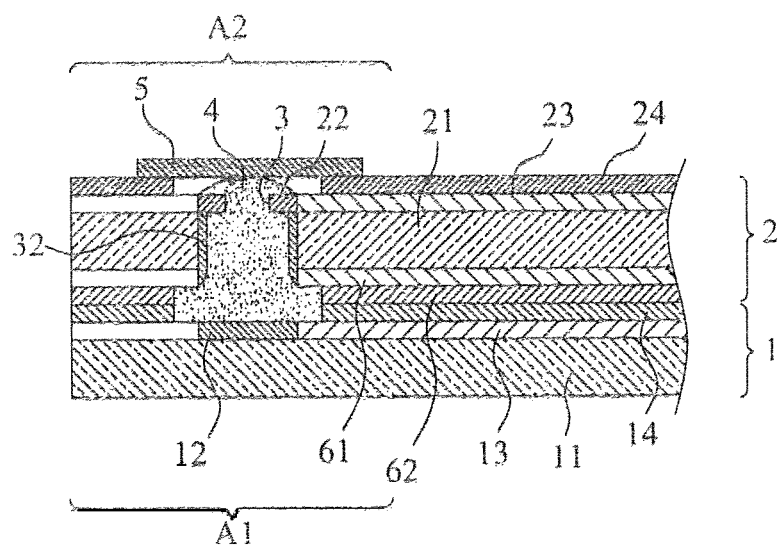
FIG. 9 is a cross-sectional view showing the third embodiment of the present invention in a condition where the first flexible circuit board and the second flexible circuit board are stacked and bonded to each other and a lapping connection is formed.

Referring to FIG. 9, after the second flexible circuit board 2 has been stacked on the first flexible circuit board 1, an interconnecting conduction member 4 is filled and deposited in the through hole 3. The interconnecting conduction member 4 is electrically connected to the second solder pad 22 of the second flexible circuit board 2, the first solder pad 12 of the first flexible circuit board 1, and the third conductive trace 61. Preferably, an insulation layer 5 is further set to cover a surface of the interconnecting conduction member 4.

The embodiments described above are provided for illustration of the present invention applied to single-sided boards and double-sided boards; however, the present invention is not limited to these applications. The first flexible circuit board 1 and the second flexible circuit board 2 of the present invention can each be one of a single-sided board, a double-sided board, a multiple-layered board, and a rigid-flex board. The multiple-layered board can be made up of multiple singles-sided s, multiple double-sided boards, or multiple single-sided boards and multiple double-sided boards. As to the rigid-flex board, it is composed of a flexible circuit board and a rigid circuit board.

Although, the present invention has been described with reference to the preferred embodiments thereof, it is apparent to those skilled in the art that a variety of modifications and changes may be made without departing from the scope of the present invention which is intended to be defined by the appended claims.

What is claimed is:

1. An interconnecting conduction structure for conductive traces of a lapped flexible circuit board, comprising:
    a first flexible circuit board, which includes a first substrate, the first substrate defining a first stacking section and having at least one first solder pad formed in the first stacking section;
    a second flexible circuit board, which includes a second substrate, the second substrate defining a second stacking section and having at least one second solder pad formed in the second stacking section;
    at least one through opening is formed in the second stacking section of the second flexible circuit board, the through opening being formed by a hole extending through the second solder pad and a hole extending through the second substrate, wherein a diameter of the hole extending through the second substrate is greater than a diameter of the hole extending through the second solder pad, and a portion of the second solder pad overlays the hole extending through the second substrate; wherein the second stacking section of the second flexible circuit board is set overlapping the first stacking section of the first flexible circuit board and the through opening corresponds in position to the first solder pad of the first flexible circuit board;
    an interconnecting conduction member filled in the through-opening to electrically connect the second solder pad of the second flexible circuit board to the first solder pad of the first flexible circuit board, the interconnecting conduction member surrounds the portion of the second solder pad overlaying the hole extending through the second substrate; and,
    an insulation layer formed on the first substrate, the insulation layer having a hole formed therethrough corresponding in position to the through opening, a diameter of the hole extending through the insulation layer being greater than the diameter of the hole extending through the second substrate, the interconnecting conduction member filling the hole in the insulation layer.

2. The interconnecting conduction structure as claimed in claim 1, wherein the first solder pad of the first flexible circuit board is electrically connected to at least one first conductive trace laid on the first substrate.

3. The interconnecting conduction structure as claimed in claim 2, wherein the first conductive trace comprises one of a power trace, a grounding trace, and a signal transmission trace.

4. The interconnecting conduction structure as claimed in claim 1, wherein the second solder pad of the second flexible circuit board is electrically connected to at least one second conductive trace laid on the second substrate.

5. The interconnecting conduction structure as claimed in claim 4, wherein the second conductive trace comprises one of a power trace, a grounding trace, and a signal transmission trace.

6. The interconnecting conduction structure as claimed in claim 1, wherein the second substrate comprises at least one third conductive trace formed on a surface thereof opposite to the second conductive trace.

7. The interconnecting conduction structure as claimed in claim 1, wherein the interconnecting conduction member comprises one of silver, aluminum, copper, tin, a conductive carbon paste, a conductive particle paste layer.

8. The interconnecting conduction structure as claimed in claim 1, wherein an insulation layer is further formed on a surface of the interconnecting conduction member.

9. The interconnecting conduction structure as claimed in claim 1, wherein the first flexible circuit board and the second flexible circuit board are each one of a single-sided board, a double-sided board, a multiple-layered board, and a rigid-flex board.

10. The interconnecting conduction structure as claimed in claim 1, wherein the hole extending through the second substrate has a hole wall conductive layer formed thereon.

11. The interconnecting conduction structure as claimed in claim 1, wherein the hole extending through the second substrate is shaped in the form of one of a circle, a rectangle, and a square.

* * * * *